United States Patent
Nastasi et al.

(10) Patent No.: US 8,461,573 B2
(45) Date of Patent: Jun. 11, 2013

(54) ORGANIC THIN FILM DEVICES WITH STABILIZED THRESHOLD VOLTAGE AND MOBILITY, AND METHOD FOR PREPARING THE DEVICES

(75) Inventors: Michael Anthony Nastasi, Sante Fe, NM (US); Yongqiang Wang, Los Alamos, NM (US); Beatrice Fraboni, Bologna (IT); Piero Cosseddu, Cagliari (IT); Annalisa Bonfiglio, Cagliari (IT)

(73) Assignee: Los Alamos National Security, LLC, Los Alamos, NM (US)

( * ) Notice: Subject to any disclaimer, the term of this patent is extended or adjusted under 35 U.S.C. 154(b) by 283 days.

(21) Appl. No.: 12/775,056

(22) Filed: May 6, 2010

(65) Prior Publication Data

US 2011/0272674 A1    Nov. 10, 2011

(51) Int. Cl.
*H01L 51/30* (2006.01)

(52) U.S. Cl.
USPC ........ 257/40; 257/98; 257/642; 257/E51.001; 257/E51.027; 257/E27.117

(58) Field of Classification Search
USPC .............. 257/40, 98, 642–643, 759, E39.007, 257/E51.001–E51.052, E27.117–E27.119
See application file for complete search history.

(56) References Cited

U.S. PATENT DOCUMENTS

2008/0296510 A1* 12/2008 Kasama et al. ........... 250/423 R

OTHER PUBLICATIONS

Ahn et al., "Scanning Photocurrent Imaging and Electronic Band Studies in Silicon Nanowire Field Effect Transistors," Nano Letters, vol. 5, No. 7 (Jun. 2005) pp. 1367-1370.

Fraboni et al., "Photocurrent studies of sexythiophene-based OFETs," Applied Physics A, vol. 95 (Apr. 2009) pp. 37-41.

Breban et al., "Photocurrent probe of field-dependent mobility in organic thin-film transistors," Applied Physics Letters, vol. 87 (Nov. 2005) pp. 203503-1-203503-3.

Burrows et al., "Reliability and degradation of organic light emitting devices," Applied Physics Letters, vol. 65 (Dec. 1994) pp. 2922-2924.

Cheng et al., "Influence of Electric Field on Microstructures of Pentacene Thin Films in Field-Effect Transistors," Advanced Functional Materials, vol. 18 (Jan. 2008) pp. 285-293.

Choo et al., "Characterization of pentacene organic thin film transistors fabricated on SiNx films by non-photolithographic processes," Thin Solid Films, vol. 420 (Dec. 2002) pp. 492-496.

Cho et al., "Extended Lifetime of Organic Field-Effect Transistors Encapsulated with Titanium Sub-Oxide as an 'Active' Passivation/Barrier Layer," Advanced Materials, vol. 21 (May 2009) pp. 1941-1944.

Chua et al., "Organic double-gate field-effect transistors: Logic-AND operation," Applied Physics Letters, vol. 87 (Dec. 2005) pp. 253512-1-253512-3.

Chwang et al., "Thin film encapsulated flexible organic electroluminescent displays," Applied Physics Letters, vol. 83, No. 3 (Jul. 2003) pp. 413-415.

Faltermeier et al., "Optical properties of pentacene thin films and single crystals," Physical Review B, vol. 74 (Sep. 2006) pp. 125416-1-125416-6.

(Continued)

*Primary Examiner* — Mamadou Diallo
(74) *Attorney, Agent, or Firm* — Samuel L. Borkowsky

(57) ABSTRACT

Organic thin film devices that included an organic thin film subjected to a selected dose of a selected energy of ions exhibited a stabilized mobility ($\mu$) and threshold voltage (VT), a decrease in contact resistance $R_C$, and an extended operational lifetime that did not degrade after 2000 hours of operation in the air.

18 Claims, 9 Drawing Sheets

OTHER PUBLICATIONS

Fraboni et al., "Photocurrent studies of stress and aging in pentacene thin film transistors," Applied Physics Letters, vol. 89 (Nov. 2006) pp. 222112-1-222112-3.

Gomes et al., "Bias-induced threshold voltages shifts in thin-film organic transistors," Applied Physics Letters, vol. 84, No. 16 (Apr. 2004) pp. 3184-3186.

Horowitz "Organic Field-Effect Transistors," Advanced Materials, vol. 10, No. 5 (Mar. 1998) pp. 365-377.

Jentzsch et al., "Efficiency of optical second harmonic generation from pentacene films of different morphology and structure," Thin Solid Films, vol. 315 (Mar. 1998) pp. 273-280.

Knipp et al., "Electric-Field-Induced Gap States in Pentacene," Advanced Materials, vol. 21 (Jun. 2009) pp. 2511-2515.

Knipp et al., "Pentacene thin film transistors on inorganic dielectrics: Morphology, structural properties, and electronic transport," Journal of Applied Physics, vol. 93, No. 1 (Jan. 2003) pp. 347-355.

Kwon et al., "Triple-layer passivation for longevity of polymer light-emitting diodes," Applied Physics Letters, vol. 79, No. 26 (Dec. 2001) pp. 4450-4452.

Lang et al., "Amorphouslike Density of Gap States in Single-Crystal Pentacene," Physical Review Letters, vol. 93, No. 8 (Aug. 2004) pp. 086802-1-086802-4.

Lee et al., "Air-Stable Polymer Electronic Devices," Advanced Materials, vol. 19 (Sep. 2007) pp. 2445-2449.

Mattheus et al., "Identification of polymorphs of pentacene," Synthetic Metals, vol. 138 (Jul. 2003) pp. 475-481.

Northrup et al., "Gap states in organic semiconductors: Hydrogen- and oxygen-induced states in pentacene," Physical Review B, vol. 68 (Jul. 2003) pp. 041202-1-041202-4.

Ogawa et al., "Photoinduced doping effect of pentacene field effect transistor in oxygen atmosphere studied by displacement current measurement," Applied Physics Letters, vol. 86 (Jun. 2005) pp. 252104-1-252104-3.

Qiu et al., "H2O effect on the stability of organic thin-film field-effect transistors," Applied Physics Letters, vol. 83, No. 8 (Aug. 2003) pp. 1644-1646.

Salleo et al., "Reversible and irreversible trapping at room temperature in poly(thiophene) thin-film transistors," Applied Physics Letters, vol. 86 (Jun. 2005) pp. 263505-1-263505-3.

Shamuilia et al., "Photoconductivity of Hf-based binary metal oxide systems," Journal of Applied Physics, vol. 104 (Dec. 2008) pp. 114103-1-114103-6.

Vollmer et al., "The effect of oxygen exposure on pentacene electronic structure," The European Physical Journal E, vol. 17 (Jun. 2005) pp. 339-343.

Weaver et al., "Organic light-emitting devices with extended operating lifetimes on plastic substrates," Applied Physics Letters, vol. 81, No. 16 (Oct. 2002) pp. 2929-2931.

Zhang et al., "Photocurrent of hydrogenated nanocrystalline silicon thin film/crystalline silicon heterostructure," Journal of Applied Physics, vol. 102 (Dec. 2007) pp. 123708-1-123708-5.

\* cited by examiner

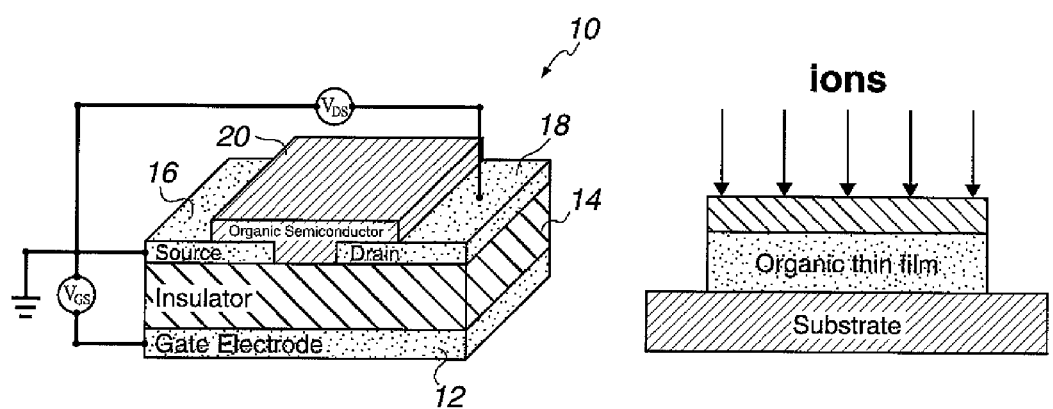
Fig. 1a  Fig. 1b

ORGANIC THIN FILM DEVICES WITH STABILIZED THRESHOLD VOLTAGE AND MOBILITY, AND METHOD FOR PREPARING THE DEVICES

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates generally to organic materials and devices and more particularly to organic thin film devices having a stabilized mobility ($\mu$), threshold voltage ($V_T$), an increased conductivity, and an enhanced lifetime of operation in the atmosphere.

BACKGROUND OF THE INVENTION

Organic thin film transistors (OTFTs) are devices that use a gate electrode to control current flow between a source electrode and a drain electrode under an imposed bias. A serious problem affecting OTFTs relates to their high sensitivity to oxygen and water in the atmosphere. Exposure of OTFTs to the atmosphere degrades their performance. Pentacene OTFTs, for example, become doped upon exposure to oxygen, and reaction with water changes the lattice structure. Light enhances these effects.

Attempts have been made at solving the degradation problems using chemical barrier layers. The barrier layers should resist penetration by air and water. They should be mechanically robust, easily handled, stable over time, and should maintain its permeability properties over time. For example, the components have been sealed inside glass, or protected from the atmosphere using a multilayer barrier of inorganic oxide separated by polymer. Although the results obtained with the multilayer barrier of inorganic oxide separated by polymer look promising, the additional thickness from a few hundred nanometers to 5-7 micrometers seriously affects the flexibility of the device. Another attempt at solving the degradation problem involves encapsulation with a $TiO_x$ layer that acts both as a shielding and oxygen scavenging layer. The carrier mobility ($\mu$) of this $TiO_x$-encapsulated device was stable in the atmosphere (i.e. in the air) for up to about 500 hours but subsequently degraded about one order of magnitude after 2000 hours.

In addition to the degradation problems, a large contact resistance $R_C$ typically exists between the organic active layer and the electrodes. Methods to reduce $R_C$ have been proposed that are based on the introduction of self assembled monolayers at the metal/organic interface or on chemical treatment of the metal electrode prior to the organic deposition. Such methods are limited because they are demanding to implement for large scale reliable fabrication processes.

Providing organic thin film devices with improved electronic properties and an extended operating lifetime in an atmospheric environment is desirable.

SUMMARY OF THE INVENTION

In accordance with the purposes of the present invention, as embodied and broadly described herein, the present invention includes an organic thin film device. The device includes a first electrode, a second electrode, and an organic thin film having a side for implantation of ions, the organic thin film having a first end in contact with the first electrode and a second end in contact with the second electrode. The organic thin film is modified by ion implantation into said side with a selected dose of ions having a selected energy, the selected dose and selected energy chosen to provide the organic thin film device with a stabilized threshold voltage, a stabilized charge carrier mobility, and an extended operational lifetime when the device is used in an atmospheric environment The invention also includes an organic field effect transistor having a organic thin film that has been implanted with a dose of ions having an energy, the energy and dose chosen for effectively modifying the organic thin film in order to render the organic thin film device less reactive with the atmosphere and provide the organic field effect transistor with a stabilized threshold voltage and a stabilized charge carrier mobility.

The invention also includes a method for increasing the lifetime of an organic thin film device. The method involves providing an organic thin film device comprising an organic thin film in contact with a first electrode and a second electrode, and implanting a dose of ions having an energy into the organic thin film, the energy and dose chosen for effectively modifying the organic thin film in order to render the organic thin film device less reactive with the atmosphere. When ion implantation occurs in a portion of the organic thin film in contact with the electrodes, then the method also results in a reduced contact resistance between the organic thin film and the electrodes. In addition, the ion implantation into the thin film results in a higher conductivity in the organic thin film transistor. In an embodiment, selective ion implantation into the electrical contact areas of an organic thin film device increased the current flowing through the device by more than 5 orders of magnitude.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 1a provides a sketch of an embodiment organic thin film device referred to herein as an organic thin film transistor (OTFT), and FIG. 1b provides a sketch of ion implantation into the organic thin film of the OTFT.

DETAILED DESCRIPTION

The invention relates generally to selectively modifying electrical properties of organic thin film devices by ion implantation into the organic thin film portion of the device.

The invention has been demonstrated using, as an example of an organic thin film device, an organic thin film transistor (OTFT). In this aspect of the invention, the properties of an OTFT were modified by ion implantation into the organic thin film of the device.

In an embodiment, a pentacene OTFT (i.e. an organic thin film transistor having pentacene as the organic thin film) was subjected to ion implantation. Various electrical properties of the pentacene OTFT were measured prior to ion implantation and after ion implantation. It was determined after these obtaining these measurements that a result of the ion implantation was that these electrical properties of the pentacene OTFT changed after ion implantation. In particular, it was determined that the mobility ($\mu$) and threshold voltage ($V_T$) and the conductivity of the device were affected by the ion implantation, and also affected was the operational lifetime of the device when operating in an atmospheric environment (i.e. in the air).

Another aspect of the invention relates to stabilizing the mobility ($\mu$) and threshold voltage ($V_T$) of organic thin film transistors (OTFTs) and increasing their conductivity and extending the operational lifetime of OTFTs when operating in an atmospheric environment.

To demonstrate the invention, and without wishing to be limited to any particular embodiment(s) of this invention, various embodiments of OTFTs having pentacene as the organic thin film were prepared. Pentacene is an organic compound with the formula

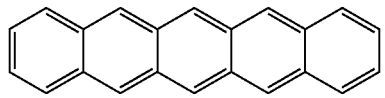 [SMILES: c1ccc2cc3cc4cc5ccccc5cc4cc3cc2c1]

The pentacene OTFTs were and implanted with $Ne^+$ or $^{14}N^+$ ions. Implantation resulted in hydrogen loss from the pentacene. It was found that the higher the dose of ions, the greater the loss of hydrogen. It was also found that hydrogen loss correlated well with a measured increase in hardness of the pentacene thin film portion of the OTFT. It was also found that ion implantation resulted in a higher conductivity in the device.

Figure 9:
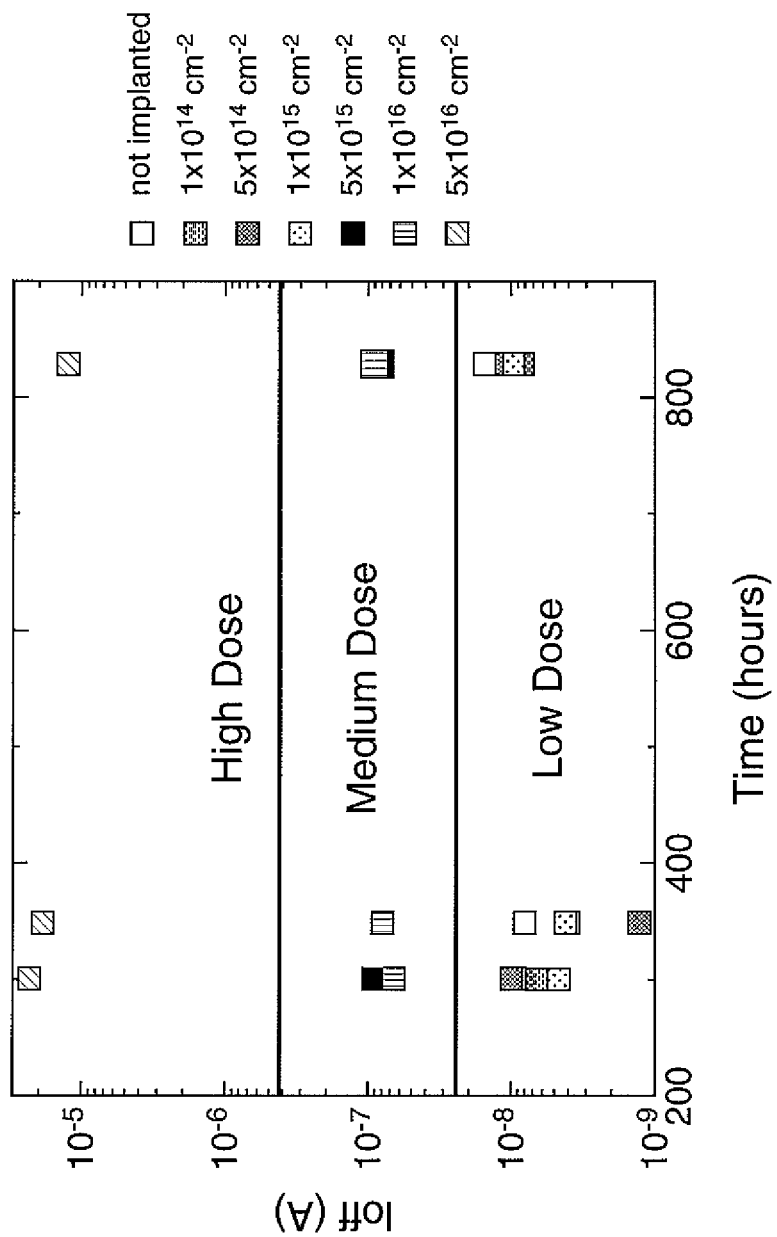
FIG. 9 provides a graph of current variation data for organic thin films implanted with doses up 25 keV $^{14}N^+$ ions.

Both the non-implanted and implanted OTFTs were subjected to photocurrent (PC) analyses. As will be shown later, the PC analyses demonstrated that the portion of the pentacene thin film not affected by ion implantation continued to function as the active layer of the OTFT. The implanted portion is not considered an active layer for the OTFT because it loses its semiconducting transport properties that are necessary for the field effect transistor performance and also for any other organic thin film device within the scope of this invention. Ion implantation changes the molecular structure of the organic thin portion subject to implantation, which changes its transport properties (as will be described and shown later in FIG. 9), into a conductor-like material. A highly conducting material cannot be used as the active layer. On the other hand, the change in conductivity due to ion implantation enhances the electrode contacts, which are usually made of a thin metal layer deposited on top of the organic semiconductor, that usually have poor charge carrier injection efficiencies just because of the semiconducting (not metal-like conducting) properties of the underlying organic thin film.

It is known in the art that the electrical transport in the organic thin film of organic thin film devices occurs in a few active molecular layers at the organic/dielectric interface. An aspect of this invention is related to the depth of ion implantation in organic thin film devices, namely, if the depth of the ion implantation is controlled, and by properly selecting the ions, their energy, and the dose of the implantation, then the electrical functionality of the device is preserved. By properly selecting the ions, their energy, and the dose of the implantation, the electrical functionality of the OTFT was preserved.

Changes in mobility and threshold voltage were measured for varying ion beam energies and doses. Low implantation doses and energies of $Ne^+$ ions resulted in a stabilization of the carrier mobility ($\mu$) while implantation with selected doses and energies of $^{14}N^+$ ions resulted in a stabilization of the OTFT threshold voltage ($V_T$). It is believed that the different behaviors may be due to differences in the electronegativities and reactivities of the ions chosen for implantation.

Another result of the implantation is that the organic thin film device was provided with an extended operating lifetime in an atmospheric environment, meaning that the device was able to operate without any significant change in the mobility, and threshold voltage, and conductivity of the device, much longer in the in the atmosphere than before the implantation. Without wishing to be bound by any particular theory or explanation, it is believed that ion implantation produced a barrier that provided protection to the underlying organic active layer from the atmosphere It is believed that the barrier produced by the implantation was less reactive with oxygen and water from the atmosphere than the unaffected portion of the organic thin film. This decrease in sensitivity to oxygen and water is believed to significantly extend the operating lifetime in an atmospheric environment for the organic thin film device after ion implantation into the organic thin film. The barrier induced by the ion implantation does not significantly affect the flexibility of the organic thin film device of this invention the way that prior devices were affected by methods of encapsulation and other thin film barriers have because the thickness of devices of this invention are not affected significantly by ion implantation.

Another aspect of this invention relates to ion implantation into selected areas of the organic thin film of the device. For example, selected areas of implantation include portions of the thin film in contact with the electrodes of the device. A result of this selective pattern of ion implantation is a controlled modification in the electrical conductivity of the organic thin film, in particular, an increase in the electrical conductivity of the devices and a reduction in the contact resistance in the implanted areas of the thin film near and in contact with electrodes of the devices.

Having thus far described the invention in a general fashion, a more detailed description follows. Reference will now be made in detail to the present preferred embodiments of the invention, examples of which are illustrated in the accompanying drawings. Similar or identical structure is identified using identical callouts.

FIG. 1a provides a sketch of an embodiment organic thin film device referred to as an organic thin film transistor 10, which includes a substrate 12 of doped silicon and a silicon dioxide layer 14 on the doped silicon substrate 12. The substrate 12 of doped silicon functions as the gate electrode of the organic thin film transistor, and the silicon dioxide layer is the gate insulator. The organic thin film transistor 10 also includes a source electrode 16 at a first end and a drain electrode 18 at a second end of silicon dioxide layer 14; the electrodes are shown in FIG. 1a at opposite ends on the same side of the silicon dioxide layer 14. An organic thin film layer 20 contacts both source electrode 16 and drain electrode 18. Substrate 12 functions as the gate electrode, controlling the flow of current from source electrode 16 to drain electrode 18.

FIG. 1b shows a sketch of ion implantation into the organic thin film layer of the OTFT. Several arrows in FIG. 1b point toward the side of the organic thin film layer being implanted with ions.

Various embodiments of the OTFT device were prepared having pentacene as the organic thin film, and ion implantation into the pentacene thin film resulted in loss of hydrogen from the pentacene thin film. Although pentacene was chosen to demonstrate the invention, and pentacene is a preferred embodiment, it should be understood that other embodiments of this invention may include materials other than pentacene to provide an organic thin film device that may be ion implanted in much the same way as will be described in detail for the pentacene thin film devices. Devices with these other films are thus also are within the scope of this invention. For example, organic thin film devices that are within the scope of this invention may include organic thin films that are organic conductors with covalently bonded hydrogen that can be removed by ion implantation. Pentacene is but one example of such an organic conductor. A non-limiting list of organic materials for organic thin film devices of this invention includes pentacene and other polycyclic aromatic hydrocarbons such as but not limited to anthracene, tetracene, rubrene (i.e. 5,6,11,12-tetraphenylnaphthacene), perylene, triphenylene, chrysene, pyrene, linear backbone conductive polymers such as but not limited to polypyrroles, polyanilines, poly(p-phenylene vinylene)s ("PPVs"), polyphenylene sulfides, and the like. Conducting polymers having contiguous $sp^2$-hybridized carbons are also materials that may be used as the material of the organic thin film. Fullerenes and substituted fullerenes may be used. Materials for organic thin films of the organic thin film devices also include substituted polycyclic aromatic hydrocarbons such as substituted pentacenes, substituted anthracenes, substituted tetracenes, substituted phthalocyanines, substituted perylenes, fluorene-based materials, substituted rubrenes, such as, but not limited to alkyl-substituted pentacenes (e.g. 1-methylpentacene, 2-methylpentacene) aryl-substituted pentacenes (e.g. 1-phenylpentacene, 2-phenylpentacene, 1-chlorophenylpentacene, 2-cyclohexylphenylpentacene), halogenated pentacenes (e.g. 1-chloropentacene, 2-fluoropentacene, 1,2-difluoropentacene), and alkoxy-substituted pentacenes (e.g. 1-aryloxypentacenes such as 1-methoxypentacene, 2-hexyloxypentacene), and the like. Materials useful for the thin film of the organic thin film devices also include substituted linear backbone conductive polymers such as but not limited to polypyrrole, polyaniline, polythiophene, and the like. Such materials may be deposited by known techniques including but not limited to thermal evaporation, spin coating, drop casting, spray coating, printing, soft lithography, and the like.

In various embodiments of this invention, pentacene OTFTs were fabricated on a highly conductive silicon substrate (the gate electrode). In an embodiment, a 500 nm silicon dioxide layer (the gate insulator) was thermally grown on the doped silicon and a bottom contact configuration with gold source and drain electrodes was employed, wherein the electrodes had a channel width of 5 millimeters and a channel length of 50 micrometers.

In an embodiment, pentacene was deposited by thermal evaporation. The pentacene film thickness was monitored using a quartz crystal microbalance. In an embodiment, a pentacene film having a thickness of 50 nm was deposited on a quartz slide. In another embodiment, a pentacene film having a thickness of 300 nm was deposited on a quartz slide. These films were used to study by PC and optical absorption the different relative weight of the "thin-film" and "bulk" phase. Pentacene OTFTs were fabricated on highly conductive silicon substrate (acting as gate electrode) with a 500 nm thermally grown silicon dioxide layer, which acts as gate insulator. The devices included a bottom contact configuration with gold source and drain electrodes (W=5 mm, L=50 μm, being W and L channel width and length respectively) patterned by means of a photolithographic process. Pentacene active layers were deposited by thermal evaporation and film thickness was monitored by a quartz crystal microbalance.

The type of ion employed for ion implantation into the organic thin film layer can also be chosen appropriately so as produce more or less irradiation damage in the organic thin film layer and at the end of the ion's range. The chemical composition of the ion together with the ions energy and dose allows complete control of the modified region of the film. Also, the implanted ions can be chosen to have no chemical reaction with the film, such is the case with inert ions such as $He^+$, $Ne^+$, $Ar^+$, $Kr^+$ and $Xe^+$, or to be chemically reactive (e.g. ions composed of an element or elements from the periodic table other than noble gases) and alter the film's electrical properties.

Figure 2B:
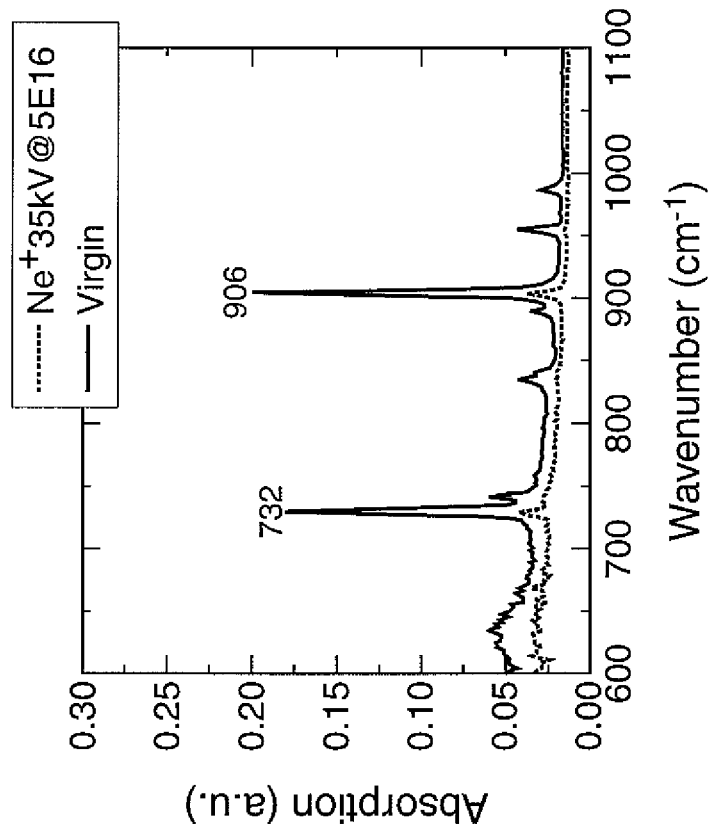
FIG. 2 shows FTIR spectra of a pentacene film after ion implantation.
Figure 2A:
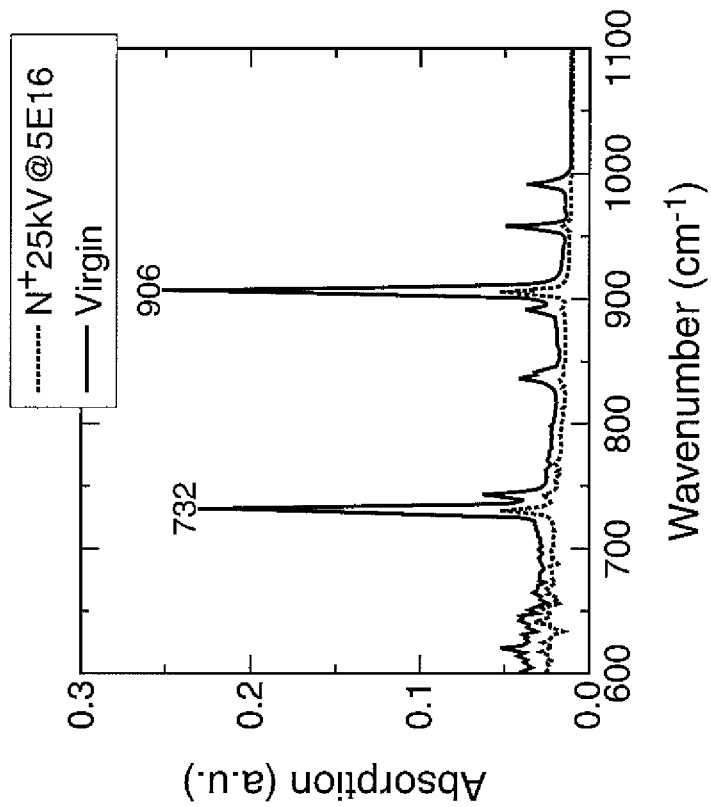

The effects of ion implantation by $N^+$ or $Ne^+$ ions were examined using Fourier transform infrared (FTIR) spectroscopy. In particular, multiple internal reflection IR (MIR-IR), which is also known in art as attenuated total reflectance or ATR), was employed to enhance the signal-to-noise ratio. ATR involves reflecting the IR beam so that it interacts repeatedly with the sample. The data were acquired under a maximum resolution of 2 $cm^{-1}$. Each spectrum is the average of 400 scans. FIG. 2a and FIG. 2b show FTIR spectra of the pentacene film after ion implantation. Two characteristic peaks from pentacene are clearly visible at 732 and 906 $cm^{-1}$. The intensities of these two peaks decreased after implantation with a dose of $5\times10^{16}$ $cm^{-2}$ of either $N^+$ or $Ne^+$. These two peaks correspond to C—H out of plane bending modes, which strongly suggests that C—H bonds in pentacene are broken by ion implantation. The resulting free hydrogen that forms likely diffuses out of the irradiated region. The spectra demonstrate that ion implantation has produced changes in the C—H, C—C and C=O molecular bonds.

Figure 3:
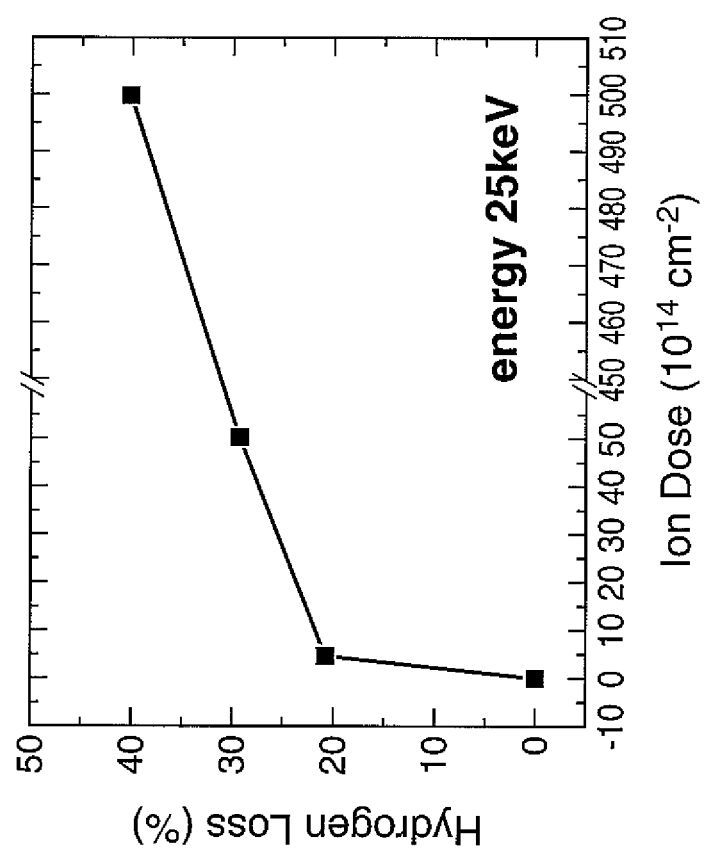
FIG. 3 shows an elastic recoil detection (ERD) spectrum of the pentacene film of FIG. 2 after ion implantation.

The ion implanted pentacene was also examined by Elastic recoil detection (ERD) to measure hydrogen content in the pentacene films before and after the ion implantation. An beam of 3 MeV $^4He^+$ ions produced from a 3.0 MV Pelletron tandem accelerator was incident on the film sample at a 75° angle (between the beam and the sample normal). Elastically recoiled hydrogen atoms resulting from the incident $^4He$ particles were detected by a silicon surface barrier detector at 30° angle (between the beam and the detection direction). A 14 μm thick of mylar foil was placed in front of the detector to filter out the forward scattering $^4He$ particles from the target so only hydrogen signal was recorded in the detector. Both small beam current (~8 nA) and small collected charge (2 μC)

were used so that the hydrogen loss during the ERD measurement was negligible. Integration of the hydrogen signals over the entire film thickness provided the total amount of hydrogen remaining in the film before and after the different ion fluence implantations. The ERD results correlate with the FTIR results, indicating hydrogen loss after $N^+$ or $Ne^+$ implantation. FIG. 3 shows an ERD spectrum after ion implantation. The EFD spectrum indicates that the hydrogen loss increases with the implantation fluence, but the rate of the hydrogen loss decreases with the fluence, because fewer H—C covalent bonds are in the film after the initial ion bombardment.

The ion implanted pentacene was also examined by X-ray photoelectron spectroscopy (XPS) and ion sputter depth profiling analyses. These experiments were conducted using a PHYSICAL ELECTRONICS 5600ci multi-technique surface science system. In profile mode, XPS data was collected in medium energy resolution in order to increase signal intensity, and for the core level photoemission spectra shown here in high resolution (better than the intrinsic chemical linewidths) for more careful chemical analysis and assignments. Ion sputtering for the depth profile analysis was done using 4 keV $Ar^+$ ions at an approximate rate of 2 nm/minute erosion rate. XPS data acquisition was alternated with ion sputtering to obtain depth resolved information for the profile. Standard relativity sensitivity factors specific to the instrument were used to convert XPS peak area intensity to relative atomic concentration.

Carrier mobility ($\mu$) and threshold voltage ($V_T$) were measured after ion implantation. Drain-source current ($I_D$) measurements were carried out at room temperature in air and in dark. An AGILENT HP 4155 Semiconductor Parameter Analyzer, provided with gold tips for contacting the electrodes, was used to control the gate voltage ($V_G$) and the drain-source voltage ($V_D$) and to measure $I_D$ (the source being the common ground). For all devices, both $\mu$ and $V_T$ were determined from the transfer characteristics in the saturation regime. Since the hysteresis was negligible for all devices, the device parameters are reported for the forward gate voltage sweep.

Figure 4B:
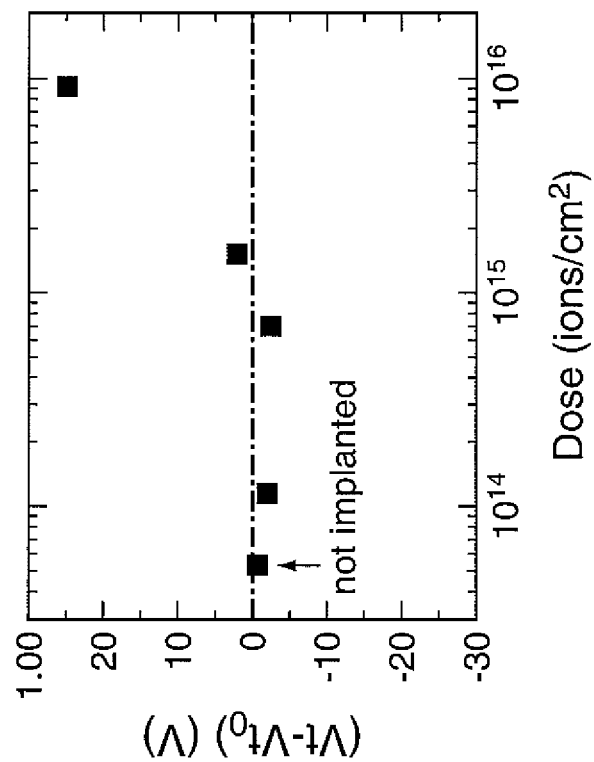
FIG. 4a provides a graph of the measured values of normalized mobility $\mu/\mu_0$ as a function of dose in ions per square centimeter for $^{14}N^+$ ions at 25 keV, and FIG. 4b provides a graph of the variation in threshold voltage as a function of $^{14}N^+$ dose in ions per square centimeter.
Figure 4A:
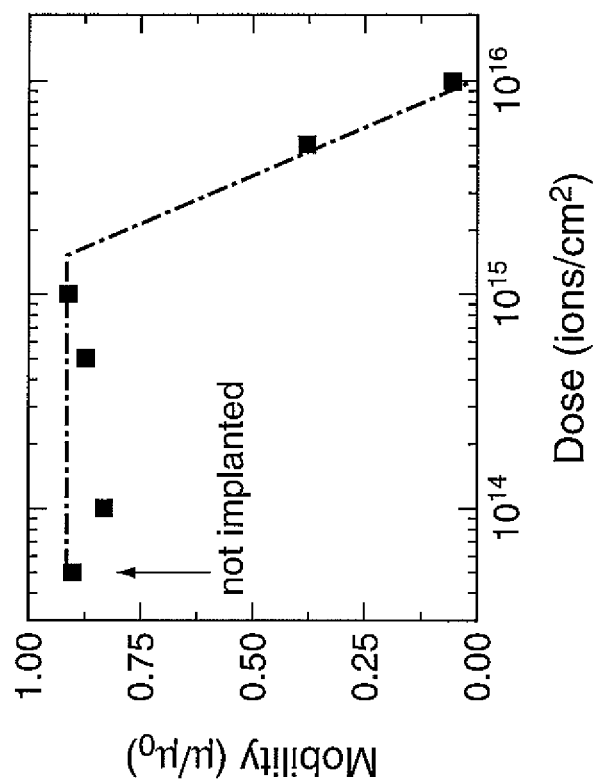

FIG. 4a provides a graphical representation of the measured values of normalized mobility $\mu/\mu_0$ (plotted on the y-axis) as a function of dose in ions per square centimeter for $^{14}N^+$ ions at 25 keV. FIG. 4b shows a plot of the variation in threshold voltage as a function of dose in ions per square centimeter. A beam energy maximum of 25 keV for $^{14}N^+$ ions was chosen in order to limit the damage to the top portion of the pentacene thin film. As FIGS. 1a and 1b show, the device performance was affected only for doses higher than about $1\times10^{15}$. This was the case for both $^{14}N^+$ ions and $Ne^+$ ions. No particular trend was detected for either the $\mu$ or $V_T$ as a function of beam energy for $^{14}N^+$ ion implantation. If $Ne^+$ ions having energies 35 keV are used for implantation, the devices lose their field effect transistor behavior.

Photocurrent (PC) spectroscopy analysis was carried out on OTFTs that were operable after implantation of different doses of 25 keV $^{14}N^+$ ions. Photocurrent spectroscopy analyses were carried out in the common mode planar configuration in the atmosphere (i.e. in the air) at room temperature with a 150 W QTH lamp coupled to a SPEX monochrometer and mechanistically chopped at low frequency (less than 20 Hz) using a current amplifier connected to a digital lock-in amplifier (STANFORD RESEARCH 850). The energy resolution was 0.01 eV at 2.40 eV. The photon flux was measured with a calibrated Si photodiode. The analyses were carried out under low-injection conditions ($1\times10^{13}$ photons/cm$^2$ at $\lambda=450$ nm) and no variations were induced in the PC spectra by the incident photon beam, as assessed by comparing consecutively acquired spectra. Optical fibers were used to avoid artifacts due to higher order harmonic wavelengths. The results are plotted in FIG. 5a and FIG. 5b.

Figure 5B:
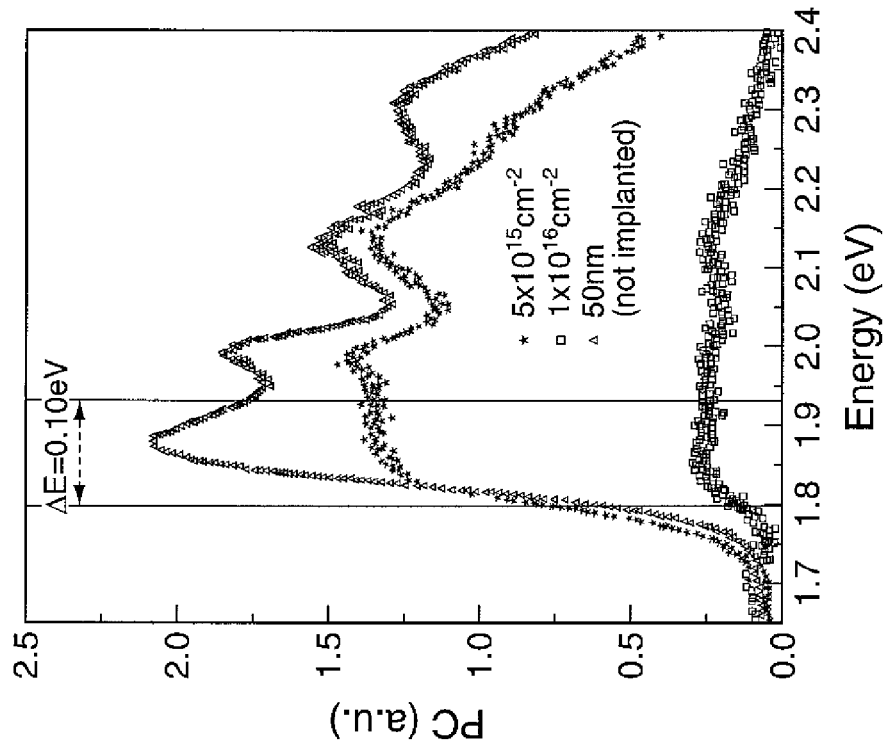
FIG. 5b shows PC spectra of a 300 nm pentacene OTFTs implanted at the highest tested doses of $^{14}N^+$ ions and compares them with a non-implanted, 50 nm thick reference sample.
Figure 5A:
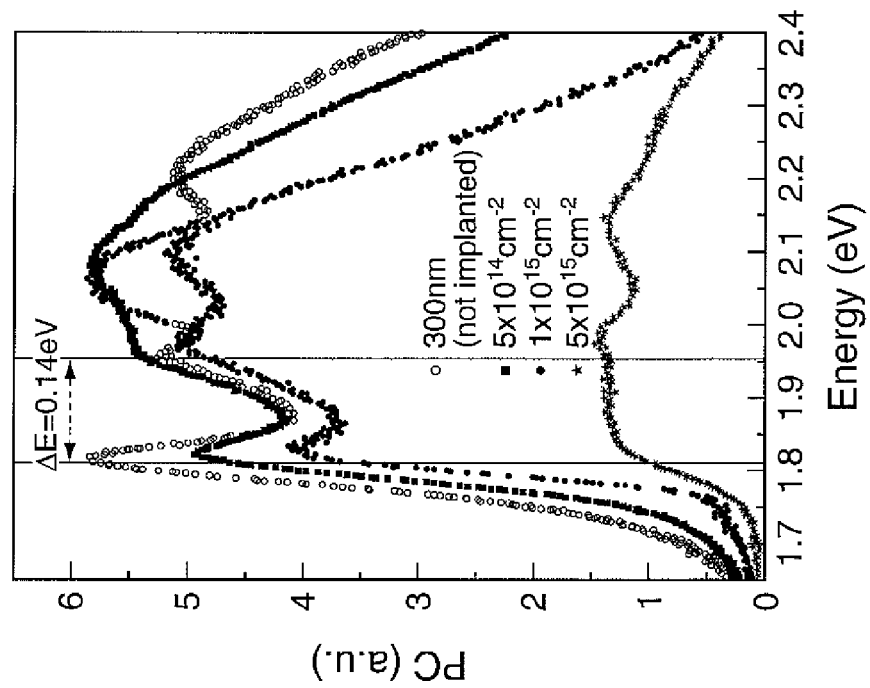
FIG. 5a provides graphs of photocurrent (PC) as a function of energy in electron volts (eV) for a 300 nm thick pentacene film implanted with three different doses of $^{14}N^+$ ions at 25 keV and a graph for a non-implanted 300 nm thick pentacene film reference sample for comparison.

FIG. 5a and FIG. 5b provide graphs of photocurrent as a function of energy in electron volts (eV) carried out on OTFTs with a 300 nm thick pentacene active layer that was still working after implantation with 25 keV $^{14}N^+$ ions. A PC spectrum of a 50 nm thick film is also reported for comparison in FIG. 5b. These graphs provide a clear indication of the presence of undamaged active pentacene.

It is known in the art that two phases coexist in pentacene films. One phase referred to as the "thin-film" phase is characterized by a molecular spacing of 15.5 Å and is dominant for thicknesses below 50 nm. The other phase is known as the "bulk" phase; it is characterized by a spacing of 14.5 Å and is dominant for films over 150 nm thick. The different molecular spacing derives from a different tilt angle of the molecular herringbone packing structure, which induces a different coupling of intermolecular $\pi$-electron systems.

The density of states distribution obtained from PC spectra may provide information about the dominant phase of the pentacene film by assessing the Davydov splitting of the first absorption band. The Davydov splitting of the first absorption band is correlated to modifications in the film molecular structure and packing and it increases when passing from the "thin-film" phase to the "bulk" phase. The measurements indicate that as the implantation dose increases, the active layer passes from a "bulk" phase dominated structure (i.e. a film greater than 150 nm thick) to a "thin-film" phase dominated structure (i.e. about 50 nm thick). Its further evolution is highlighted in FIG. 5b where the PC spectra of OTFTs implanted at the highest tested doses are compared with a non-implanted, 50 nm thick reference sample. It is noteworthy that the extremely poor quality of the highest dose implanted sample ($1\times10^{16}$) correlates well with the loss of the OTFT device functionality. This effect is an indication that a thin layer of pentacene can still be preserved under the damaged top layer after ion implantation with selected doses and energies, and this layer grants the full functionality of the implanted OTFTs. Therefore, by properly choosing ion implantation conditions, OTFT performance is preserved.

Figure 6:
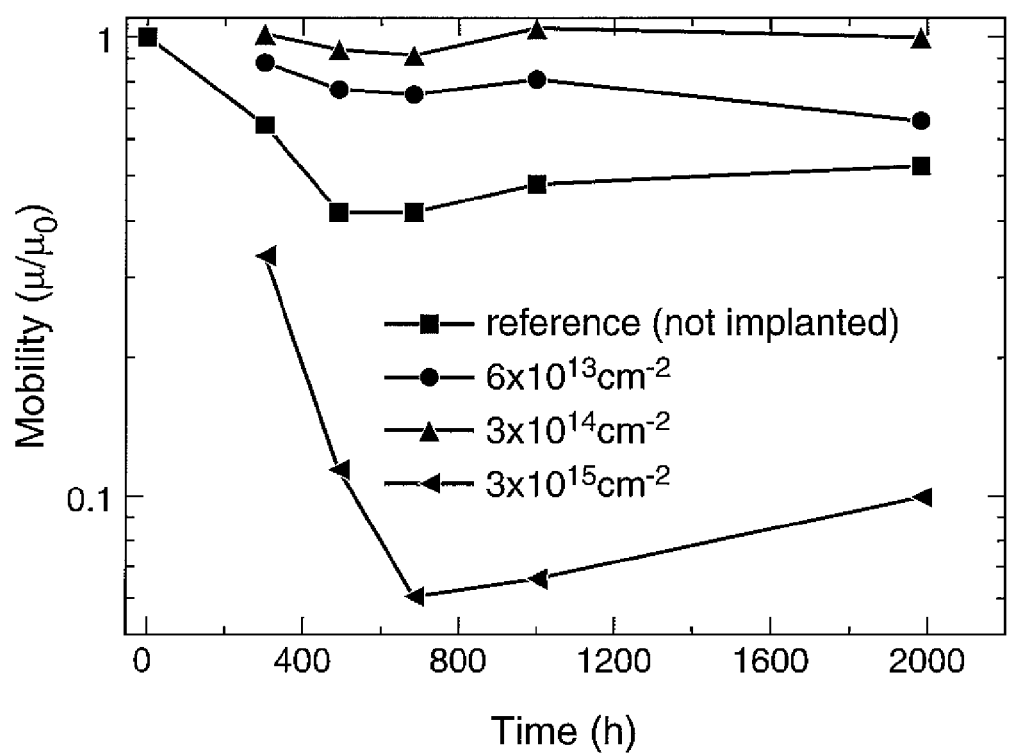
FIG. 6 provides a logarithmic graph of results for mobility versus time for three different doses of 35 keV $Ne^+$ ions into an OTFT pentacene thin film.
Figure 7B:
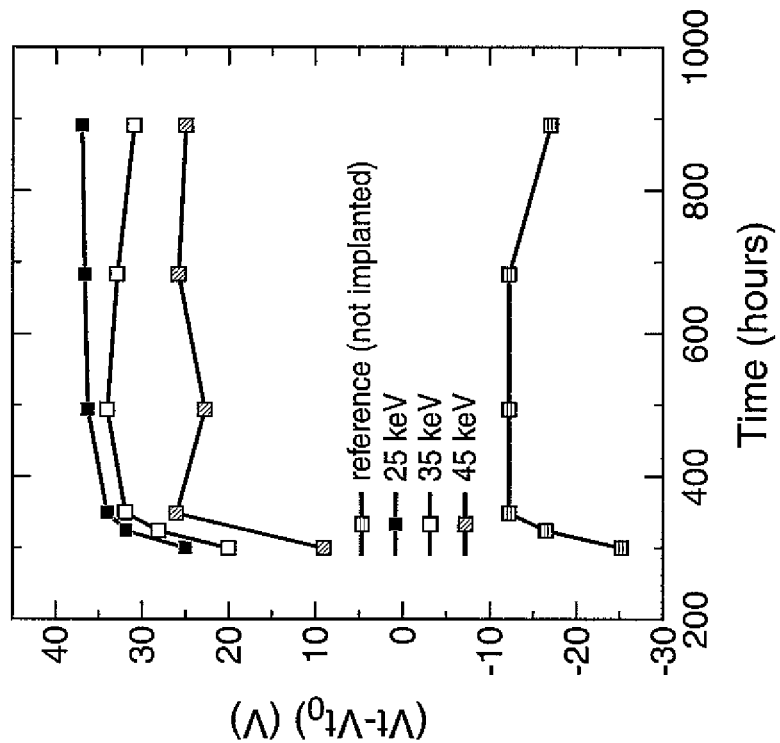
FIG. 7b provides graphs for pentacene films implanted with a dose of $5\times10^{15}$ at three different energies (25 keV, 35 keV, and 45 keV).
Figure 7A:
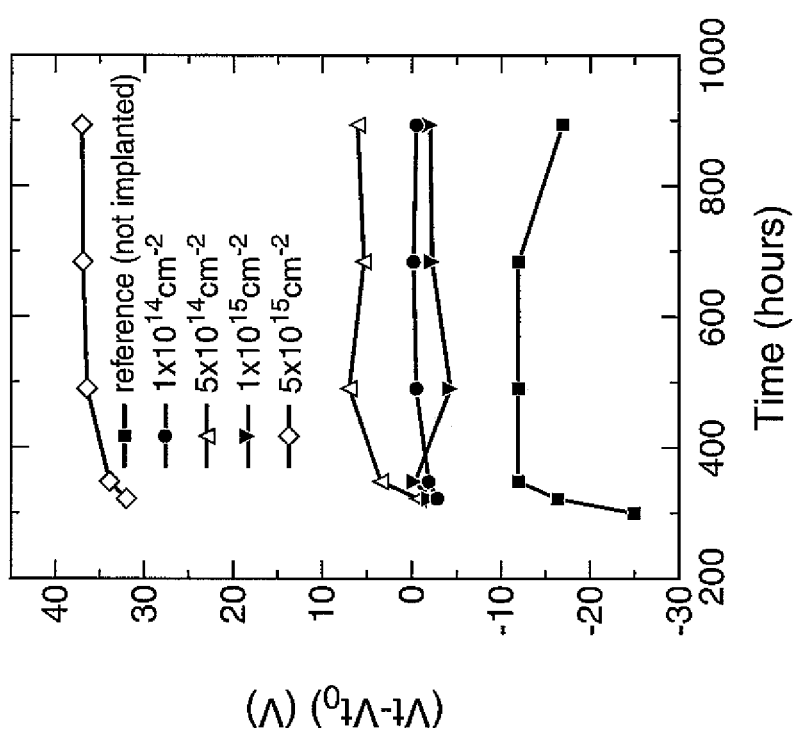
FIG. 7a provides threshold variation data plotted as a function of time for various doses of 24 keV $^{14}N^+$ ions.

The mobility and the threshold voltage for OTFTs implanted with $Ne^+$ or $^{14}N^+$ were monitored over time to determine whether the implantation had any effect on the degradation of the device performance. The results are shown in FIG. 6 and FIGS. 7a and 7b. Turning first to FIG. 6, results for mobility (plotted logarithmically) versus time are shown for three different doses of 35 keV $Ne^+$ ions into an OTFT pentacene thin film. A plot for a reference sample of pentacene that was not subjected to ion implantation is also included for comparison. The plot at the bottom shows results of implanting pentacene with a dose of $3\times10^{15}$ 35 keV $Ne^+$. A comparison with the other plots clearly shows this film had the worst performance of all those tested. Thus, a dose of $3\times10^{15}$ keV of $Ne^+$ was experimentally determined to be too high a dose of 35 keV $Ne^+$. The plot for the reference sample appears next. The mobility decreases noticeably from the starting value $\mu_0$ ($\mu/\mu_0$) over the first 500 hours or so of operating in the atmosphere, and then stabilizes over the next 1500 hours. Finally, the samples having the least amount of performance degradation over the 2000 hour period appear at the top of the graph. These were implanted with doses of $6\times10^{13}$ and $3\times10^{14}$. These two implanted OTFTs show the highest mobility with little or no degradation after operating for 2000 hours in the atmosphere. As the plots show, their mobilities do not noticeably degrade over a 2000 hour in period.

FIG. 7a provides threshold variation data plotted as a function of time for various doses of 25 keV $^{14}N^+$ ions. FIG. 7b provides threshold variation data plotted for a dose of 5×1015 dose of $^{14}N^+$ ions at three different energies (25 keV, 35 keV, and 45 keV). The following observations were made: (i) ion implantation resulted in a stabilization of carrier mobility ($\mu$) and threshold voltage ($V_T$) for at least up to 2000 hours after the implantation process; (ii) low implantation doses (up to $3 \times 10^{14}$) of 35 keV Ne+ ions stabilize the carrier mobility ($\mu$) as shown in FIG. 4; (iii) implantation with selected doses and energies of $^{14}N^+$ ions induces a stabilization of the OTFT threshold voltage ($V_T$) as shown in FIG. 7. The stabilization of $V_T$ is optimized such that little or no variation in the threshold voltage $V_T$ was detected for 25 keV ions and for doses up to $5 \times 10^{14}$. It should be noted that higher doses and energies also induce a stabilization of $V_T$, even if it occurs at values that are largely shifted with respect to the reference, non-implanted device.

Differences in the behavior of OTFTs implanted with $^{14}N^+$ ions compared to Ne$^+$ ions may be due to differences in the electronegativities of the ions. Neon is a chemically unreactive element while nitrogen much more electronegative. Ne$^+$ would not be expected to form covalent bonds with pentacene, but nitrogen may.

Figure 8C:
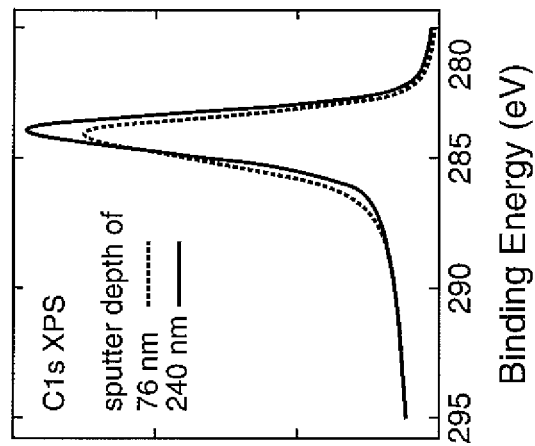
FIG. 8 provides an XPS depth profile for a pentacene layer implanted with a $5\times10^{16}$ does of 24 keV $^{14}N^+$ ions.
Figure 8B:
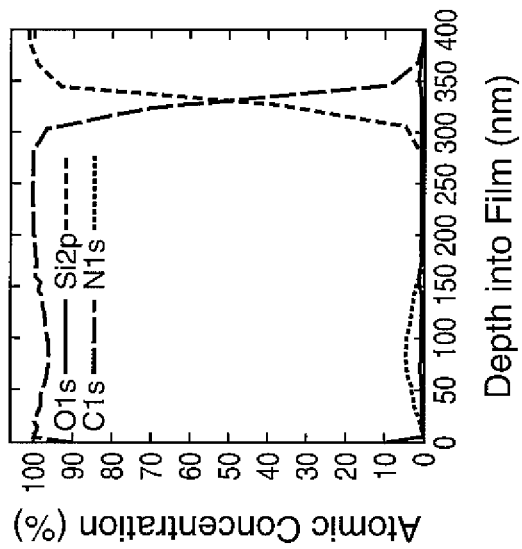
Figure 8A:
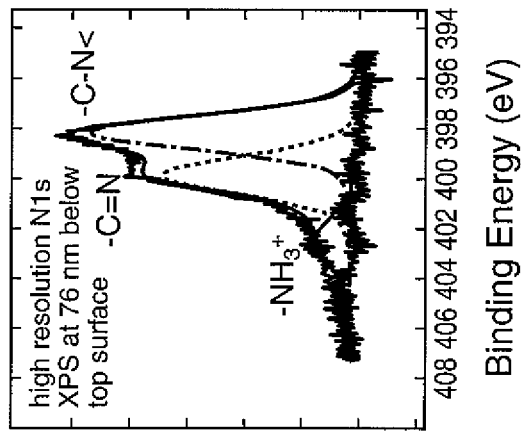

The chemical structures of pentacene OTFTs implanted with $^{14}N^+$ and with $N^+$ were examined using alternating depth-resolved X-ray photoelectron spectroscopy (XPS). FIG. 8 shows an XPS depth profile for a pentacene layer implanted with a $5 \times 10^{16}$ dose of 25 keV $^{14}N^+$ ions. The $^{14}N$ concentration peaks at a depth of about 76 nm from the top surface, and at the peak value it is present in a 4.5% atomic configuration. The spectral data are consistent with a terminal nitrile group bonded to an aromatic ring (—C—N (398.1 eV), and —C—N (399.7 eV) (FIG. 8a inset). A minor third component at higher binding energy may be —NH$^{+3}$. These observations suggest that N reacts with the hydrocarbon matrix and possibly induces the activation/formation of stable positive charges within the pentacene layer. The observed broadening of the C1s peak to higher binding energy when N is present in the organic matrix (FIG. 8b) is consistent with the activation of a C—N functionality. These modifications lead to a different polarizability apart from the pure pentacene that likely affects the materials electrical behavior.

No Ne signal was detected with depth-resolved XPS analyses on Ne$^+$ ion implanted samples. The lack of such a signal suggests that implanted Ne did not form covalent bonds with the hydrocarbon matrix. Thus, Ne was likely lost to vacuum during XPS analyses.

XPS results strongly suggest that N implantation gives rise to a positively charged layer that reaches different depths, controlled by the implant energy. The measured threshold voltage shift seems to be proportional to the thickness of the undamaged layer, i.e. to the difference between the film thickness and the implant depth (FIG. 7b).

Without wishing to be bound by any particular theory or explanation, a simple effect could also explain the data. The implanted charged layer induces an electric field that superposes to the gate field, thus rigidly shifting the $V_T$ towards more positive values. The implanted charged layer induces an electric field that superposes to the gate field, thus pushing holes towards the insulating layer, i.e. into the device channel. As a consequence, it becomes necessary to apply a positive gate voltage in order to deplete the channel and to switch the device off. This shift in the threshold voltage is proportional to the distance between the charged implanted layer and the channel, in good agreement with what was observed in implanted OTFTs.

By choosing appropriate ion energy and doses, ion implantation can be used to modify the conductivity of organic thin films up to 5 orders of magnitude (FIG. 9), with the possibility of selectively patterning the implanted area. This effect is also stable with time (up to 2000 hours after the irradiation) and is induced by both $^{14}N^+$ and with Ne$^+$ ions. Such a strong increase in the material conductivity greatly reduces the contact resistance ($R_C$) of the material and can be exploited in the optimization of the electrode injection properties in organic devices.

In summary, a controlled, low energy, ion implantation into the organic thin film of an OTFT enhances the lifetime of the OTFT without increasing the thickness of the OTFT. Ion implantation can be safely carried out on fully operational devices. The implantation modifies the structure of the top portion of the organic thin film. The implantation produces a barrier that reduces the sensitivity to oxygen and water vapor and stabilizes the carrier mobility and device threshold voltage over an extended operational lifetime in the atmosphere. By selecting ions ($^{14}N^+$) that can react with the hydrocarbon matrix (e.g. pentacene), the charge distribution within the organic matrix can be locally modified and controlled. The conductivity of the organic thin film can also be modified up to 5 orders of magnitude, and it is possible to selectively pattern the exposed and modified areas of the organic thin film without any lithographic mask. This effect allows to locally reduce the contact resistance of the organic thin film with a controlled reproduction of the desired patterns, which is believed to result in locally enhancing the carrier injection efficiency and improving the performance of the device electrodes there fabricated.

Although the present invention has been described with reference to specific details, it is not intended that such details should be regarded as limitations upon the scope of the invention, except as and to the extent that they are included in the accompanying claims. For example, film thicknesses of 50 nm and 300 nm were chosen because they are thicknesses that are commonly employed as active layers in OTFTs. It should be understood that the invention is not limited to these thickness, or to any particular thickness of any particular material used for the organic thin film layer. Thinner or thicker organic films layers may also be prepared and implanted with ions of appropriate energy and dose to modify a controlled portion of the layer and provide an organic thin film device of this invention. For a thicker organic thin film layer, we only need to modify the implanted ion energy in order to reach a greater depth within the organic film and to implant the desired portion of the film. The energy and dose of the implantation ions can be estimated using a simulation program, such as TRIM, which allows locating the ion at a particular depth in the film along with adjusting its concentration.

In addition, as should be understood from the above description, the interaction of ions with the organic thin film layer of the organic thin film device will only affect the exposed part of the organic thin film. Therefore, the ion implantation process may also be applied to organic thin film devices with any geometry, channel size, etc. The implantation process may be used with devices having different geometries of source and drain contacts, and with different geometries of substrates. The implantation may be used with other organic thin film devices besides organic thin film transistors. Some non-limiting examples of other organic thin film devices that may be implanted to produce embodiment devices of the present invention include light emitting diodes (LEDS) having organic thin films, solar cells having organic thin films, RFIDs having organic thin films, and the like. The organic thin films of these devices may be implanted with ions in much the same way as has been described for OTFTs, and the implanted ions will only selectively interact with the intentionally exposed areas, and the ion implantation is expected to affect the thin films of these devices and the device performance as has been described above for the various embodiment ion implanted OTFTs.

What is claimed is:

1. An organic thin film device capable of operating with a stabilized threshold voltage for at least 2000 hours in an oxygen environment, said device prepared by a process comprising:
providing an apparatus comprising a first thin film having a first end in contact with a first electrode and a second end in contact with a second electrode, and
implanting into said organic thin film a selected dose of ions having an energy suitable for loss of hydrogen from the thin film and a change in the molecular structure of the thin film to provide a barrier that results in a stabilized threshold voltage, a stabilized charge carrier mobility, a reduction of the contact resistance between the electrodes and the organic thin film, and an extended operational lifetime of a least 2000 hours when the device is used in an atmospheric environment.

2. The organic thin film device of claim 1, wherein the organic thin film comprises a material selected from organic polycyclic aromatic hydrocarbons, substituted polycyclic organic aromatic hydrocarbons, and linear conductive polymers.

3. The organic thin film transistor of claim 1, wherein the organic thin film is a material selected from anthracene, tetracene, rubrene, perylene, triphenylene, chrysene, pyrene, polypyrroles, polyanilines, poly(p-phenylene vinylene)s ("PPV"), polyphenylene sulfides, polythiophene, fullerenes, substituted fullerenes, substituted pentacenes, substituted anthracenes, substituted tetracenes, substituted phthalocyanines, substituted perylenes, fluorene-based materials, substituted rubrenes, and combinations thereof.

4. The organic thin film device of claim 1, wherein the organic thin film is pentacene.

5. The device of claim 1, wherein the operational lifetime of the device is at least 2000 hours of operation wherein the mobility and threshold voltage are stabilized when the device is used in the atmosphere.

6. The device of claim 1, wherein the ions are selected from $Ne^+$ and $^{14}N^+$.

7. An organic thin film transistor having a first electrode, a second electrode, and an organic thin film in contact with the first electrode and second electrode, the organic thin film implanted with a dose of ions having an energy, the energy and dose chosen for effectively modifying the organic thin film with a barrier in order to provide the organic thin film transistor with a stabilized threshold voltage, a stabilized charge carrier mobility, a reduction of the contact resistance between the electrodes and the organic thin film, and an extended operational lifetime of at least 2000 hours when the device is used in an atmospheric environment.

8. The organic thin film device of claim 7, wherein the organic thin film comprises a material selected from organic polycyclic aromatic hydrocarbons, substituted polycyclic organic aromatic hydrocarbons, and linear conductive polymers.

9. The organic thin film transistor of claim 7, wherein the organic thin film is a material selected from anthracene, tetracene, rubrene, perylene, triphenylene, chrysene, pyrene, polypyrroles, polyanilines, poly(p-phenylene vinylene)s ("PPV"), polyphenylene sulfides, polythiophene, fullerenes, substituted fullerenes, substituted pentacenes, substituted anthracenes, substituted tetracenes, substituted phthalocyanines, substituted perylenes, fluorene-based materials, substituted rubrenes, and combinations thereof.

10. The organic thin film transistor of claim 7, wherein the organic thin film is pentacene.

11. The organic thin film transistor device of claim 10, wherein the operational lifetime of the device is at least 2000 hours of operation wherein the mobility and threshold voltage are stabilized when the device is used in the atmosphere.

12. The organic thin film transistor of claim 7, wherein the ions are selected from $Ne^+$ and $^{14}N^+$.

13. A method for increasing the operating lifetime of an organic thin film device operating in an atmosphere comprising air and water, comprising:
providing an organic thin film device comprising an organic thin film in contact with a first electrode and a second electrode, and
implanting a dose of ions having an energy into the organic thin film, the energy and dose chosen for effectively modifying the organic thin film to provide it with a barrier, said barrier providing the thin film with a stabilized threshold voltage, a stabilized charge carrier mobility, a reduction of the contact resistance between the electrodes and the organic thin film, and an extended operational lifetime when the device is used in an atmospheric environment.

14. The method of claim 13, wherein the first electrode is a source electrode and the second electrode is a drain electrode and the organic thin film device is an organic thin film transistor.

15. The method of claim 13, wherein the organic thin film is selected from organic polycyclic aromatic hydrocarbons, substituted polycyclic organic aromatic hydrocarbons, and linear conductive polymers.

16. The method of claim 13, wherein the organic thin film is a material selected from anthracene, tetracene, rubrene, perylene, triphenylene, chrysene, pyrene, polypyrroles, polyanilines, polyp-phenylene vinylene)s ("PPV"), polyphenylene sulfides, polythiophene, fullerenes, substituted fullerenes, substituted pentacenes, substituted anthracenes, substituted tetracenes, substituted phthalocyanines, substituted perylenes, fluorene-based materials, substituted rubrenes, and combinations thereof.

17. The method of claim 13, wherein the organic thin film is pentacene.

18. The method of claim 13, wherein the operational lifetime of the device is at least 2000 hours of operation wherein the mobility and threshold voltage are stabilized when the device is used in the atmosphere.

* * * * *